(12) United States Patent
Nishikawa

(10) Patent No.: US 11,715,676 B2
(45) Date of Patent: Aug. 1, 2023

(54) SEMICONDUCTOR DEVICE

(71) Applicant: Amkor Technology Singapore Holding Pte. Ltd., Valley Point (SG)

(72) Inventor: Kenji Nishikawa, Sagamihara (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 90 days.

(21) Appl. No.: 17/155,248

(22) Filed: Jan. 22, 2021

(65) Prior Publication Data
US 2021/0143087 A1     May 13, 2021

Related U.S. Application Data

(63) Continuation of application No. 16/431,691, filed on Jun. 4, 2019, now Pat. No. 10,910,294.

(51) Int. Cl.
*H01L 23/00*      (2006.01)
*H01L 23/495*      (2006.01)
(Continued)

(52) U.S. Cl.
CPC .... *H01L 23/49524* (2013.01); *H01L 21/4825* (2013.01); *H01L 21/565* (2013.01);
(Continued)

(58) Field of Classification Search
CPC ............... H01L 21/565; H01L 21/4825; H01L 21/67288; H01L 21/4853; H01L 21/583; H01L 23/49513; H01L 23/49562; H01L 23/3114; H01L 23/4952; H01L 23/49524; H01L 24/37; H01L 24/84; H01L 24/40; H01L 24/45; H01L 24/83; H01L 24/32; H01L 24/85; H01L 24/48; H01L 24/29; H01L 24/73; H01L 24/06; H01L 24/92; H01L 2224/32245; H01L 2224/73221; H01L 2224/84815; H01L 2224/37011; H01L 2224/37013; H01L 2224/40245; H01L 2224/45014; H01L 2224/84801; H01L 224/45144; H01L 2224/73263;
(Continued)

(56) References Cited

U.S. PATENT DOCUMENTS 4,994,412 A     2/1991    Kalfus
6,069,408 A     5/2000    Honda
(Continued)

*Primary Examiner* — Nikolay K Yushin
(74) *Attorney, Agent, or Firm* — Kevin B. Jackson

(57) ABSTRACT

A packaged electronic device includes a substrate comprising a die pad and a lead spaced apart from the die. An electronic device is attached to the die pad top side. A conductive clip is connected to the substrate and the electronic device, and the conductive clip comprises a plate portion attached to the device top side with a conductive material, a clip connecting portion connected to the plate portion and the lead, and channels disposed to extend inward from a lower side of the plate portion above the device top side. The conductive material is disposed within the channels. In another example, the plate portion comprises a lower side having a first sloped profile in a first cross-sectional view such that an outer section of the first sloped profile towards a first edge portion of the plate portion is spaced away from the electronic device further than an inner section of the first sloped profile towards a central portion of the plate portion. Other examples and related methods are also disclosed herein.

20 Claims, 11 Drawing Sheets

(51) Int. Cl.
*H01L 23/31* (2006.01)
*H01L 21/48* (2006.01)
*H01L 21/56* (2006.01)

(52) U.S. Cl.
CPC ...... *H01L 23/3114* (2013.01); *H01L 23/4952* (2013.01); *H01L 23/49513* (2013.01); *H01L 23/49562* (2013.01); *H01L 24/37* (2013.01); *H01L 24/40* (2013.01); *H01L 24/84* (2013.01); *H01L 2224/37011* (2013.01); *H01L 2224/40245* (2013.01); *H01L 2224/84815* (2013.01)

(58) Field of Classification Search
CPC . H01L 2224/48091; H01L 2224/45147; H01L 2224/84345; H01L 2224/92246; H01L 2224/2919; H01L 2224/37012; H01L 2224/45124; H01L 2224/8385; H01L 2224/06181; H01L 2224/83801; H01L 2224/0603; H01L 2224/2929; H01L 2224/37147; H01L 2224/29101; H01L 2224/92247; H01L 2224/48247; H01L 224/92224; H01L 2224/73265; H01L 2924/0665; H01L 2924/00014; H01L 2224/45144; H01L 2224/05599; H01L 2924/1203; H01L 2924/1305; H01L 2924/37001; H01L 2924/181; H01L 2924/13055; H01L 2924/13091; H01L 2924/00012; H01L 2924/014; H01L 2924/00

See application file for complete search history.

(56) References Cited

U.S. PATENT DOCUMENTS

| | | |
|---|---|---|
| 6,455,348 B1 | 9/2002 | Yamaguchi |
| 7,005,325 B2 | 2/2006 | Chow |
| 8,987,878 B2 | 3/2015 | Feng |
| 9,184,117 B2 | 11/2015 | Ho |
| 10,211,128 B2 | 2/2019 | Mangrum |
| 2007/0099349 A1 | 5/2007 | Adachi |
| 2007/0298544 A1 | 12/2007 | Oman |
| 2008/0067643 A1 | 3/2008 | Tanaka |
| 2011/0111562 A1 | 5/2011 | San Antonio |
| 2012/0104580 A1 | 5/2012 | Feng |
| 2013/0001804 A1 | 1/2013 | Shimanuki |
| 2013/0037837 A1 | 2/2013 | Kang |
| 2013/0126988 A1 | 5/2013 | Lo |
| 2013/0181332 A1 | 7/2013 | Kelkar |
| 2013/0309816 A1 | 11/2013 | Xue |
| 2014/0191380 A1 | 7/2014 | Lee |
| 2014/0264797 A1 | 9/2014 | Ota |
| 2015/0102478 A1 | 4/2015 | Suthiwongsunthorn |
| 2016/0308104 A1 | 10/2016 | Sasaoka |
| 2017/0033271 A1 | 2/2017 | Gruendl |
| 2018/0350726 A1 | 12/2018 | Mangrum |

SEMICONDUCTOR DEVICE

CROSS-REFERENCE TO RELATED APPLICATIONS

The present application is a continuation application of U.S. patent application Ser. No. 16/431,691 filed on Jun. 4, 2019 and issued as U.S. Pat. No. 19,910,294 on Feb. 2, 2021, the contents of which in its entirety are herein incorporated by reference.

BACKGROUND OF THE DISCLOSURE

The present disclosure relates, in general, to electronics, and more particularly, to semiconductor packages, structures thereof, and methods of forming semiconductor packages.

Prior semiconductor packages and methods for forming semiconductor packages are inadequate, for example resulting in excess cost, poor thermal performance, decreased reliability, relatively low performance, or package sizes that are too large. More particularly, some packaged semiconductor devices include semiconductor devices, such as power discrete metal-oxide semiconductor field effect transistor (MOSFET) devices that use conductive clip structures to electrically connect a current carrying electrode to one or more conductive leads on a conductive substrate structure. Typically, a solder attach layer has been used to attach a flat plate-like surface of the conductive clip structure to the semiconductor device. This technique has had solder wettability issues, which has resulted in incomplete solder joints or solder voids. Such issues create reliability and yield issues. One prior approach to improve solder wettability has been to add bumps to the bonding surface of the plate-like surface of the conductive clip structure; however, such bumps have not resolved the incomplete solder joints or solder void issues.

Accordingly, it is desirable to have a package structure and a method that provides a packaged electronic device that overcomes the shortcomings of the prior art. It is also desirable for the structure and method to be easily incorporated into manufacturing flows, accommodate multiple die interconnect schemes, and to be cost effective.

BRIEF SUMMARY

The present description includes, among other features, a packaged electronic device structure and associated methods that comprise a conductive clip having features that improve solder wettabililty. In some examples, the features include a shaped plate portion that attaches to the solder layer. In some examples, the shape includes a convex shape, sloped profile, or sloped shape with respect to the solder layer such that edge portions of the plate portion are vertically spaced to a greater extent than a center portion of the plate portion in a cross-sectional view. In other examples, the features include through-holes in the plate portion, channel regions, combinations thereof including combinations with the shaped or sloped profile plate portion. The features help facilitate the removal of gas(es), such as air generated during the solder reflow process thereby improving solder wettability and reducing the formation of solder voids. In addition, when the features include through-holes, the solder migrates up into the through-holes to provide an anchoring effect for the conductive clip. Further, the features reduce reliability issues associated with solder overflowing from the connection area of the semiconductor die, which improves reliability.

More particularly, in one example, a semiconductor device comprises a substrate including a die pad having a die pad top side and an opposing die pad bottom side, and a lead spaced apart from the die pad. A semiconductor die is attached to the die pad top side, wherein the semiconductor die comprises a die top side, and a die bottom side opposite to die top side connected to the die pad top side. A conductive clip is connected to the semiconductor die and the substrate, wherein the conductive clip comprises a plate portion attached to the die top side with a conductive material, and a clip connecting portion coupled to the plate portion and the lead. The plate portion comprises a lower side having a first sloped profile in a first cross-sectional view such that an outer section of the first sloped profile towards a first edge portion of the plate portion is spaced away from the semiconductor die further than an inner section of the first sloped profile towards a central portion of the plate portion. In an additional example, the lower side of the plate portion comprises channels that intersect each other, and an upper surface of one of the channels comprises the first sloped profile.

In another example, a packaged electronic device includes a substrate comprising a die pad having a die pad top side and an opposing die pad bottom side, and a lead spaced apart from the die pad. An electronic device is attached to the die pad top side, wherein the electronic device comprises a device top side, and a device bottom side connected to the die pad top side. A conductive clip is connected to the substrate and the electronic device, wherein the conductive clip comprises a plate portion attached to the device top side with a conductive material, a clip connecting portion coupled to the plate portion and the lead, and channels disposed to extend inward from a lower side of the plate portion above the device top side, wherein the conductive material is disposed within the channels.

In a further example, a method of forming a packaged electronic device includes providing a substrate comprising a die pad having a die pad top side and an opposing die pad bottom side, and a lead spaced apart from the die pad. The method includes attaching an electronic device to the die pad top side, wherein the electronic device comprises a device top side, and a device bottom side opposite to the device top side connected to the die pad top side. The method includes attaching a conductive clip to the electronic device and the substrate, wherein the conductive clip comprises a first portion attached to the device top side with a conductive material, and a second portion coupled to the first portion and the lead. The first portion comprises one or more of a first sloped profile comprising an outer section towards a first edge portion of the first portion and an inner section towards a central portion of the first portion, with outer section spaced away from the electronic device further than the inner section, or channels disposed inward from a lower side of the first portion above the device top side.

Other examples are included in the present disclosure. Such examples may be found in the figures, in the claims, and/or in the description of the present disclosure.

Figure 1:
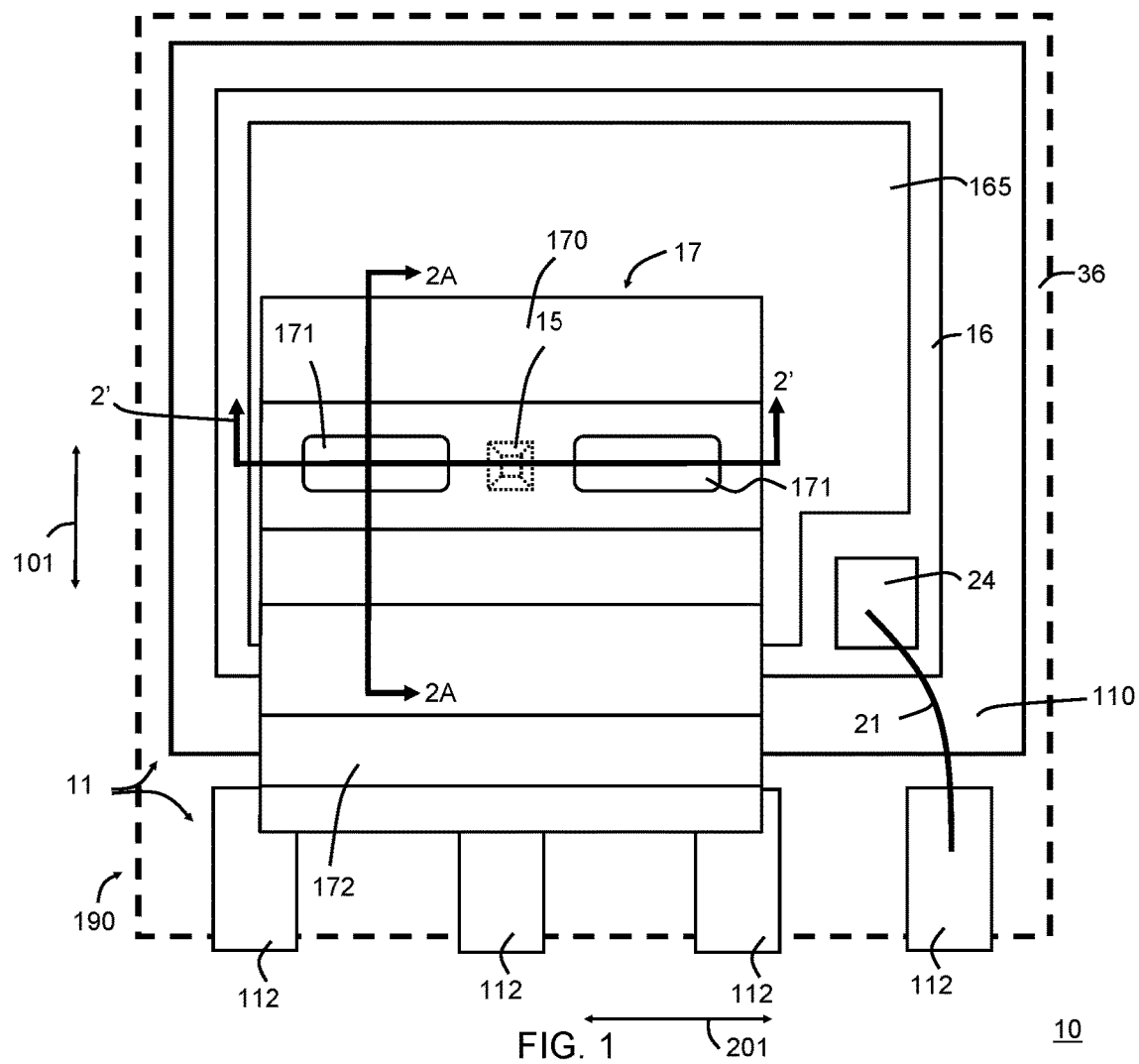
FIG. 1 illustrates a top plan view of a packaged electronic device of the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular example embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one example" or "an example" means that a particular feature, structure or characteristic described in connection with the embodiment is included in at least one example of the present invention. Thus, appearances of the phrases "in one example" or "in an example" in various places throughout this specification are not necessarily all referring to the same example, but in some cases it may. Furthermore, the particular features, structures or characteristics may be combined in any suitable manner, as would be apparent to one of ordinary skill in the art, in one or more example embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}. It is further understood that the examples illustrated and described hereinafter suitably may have examples and/or may be practiced in the absence of any element that is not specifically disclosed herein.

DETAILED DESCRIPTION OF THE DRAWINGS

Figure 2A:
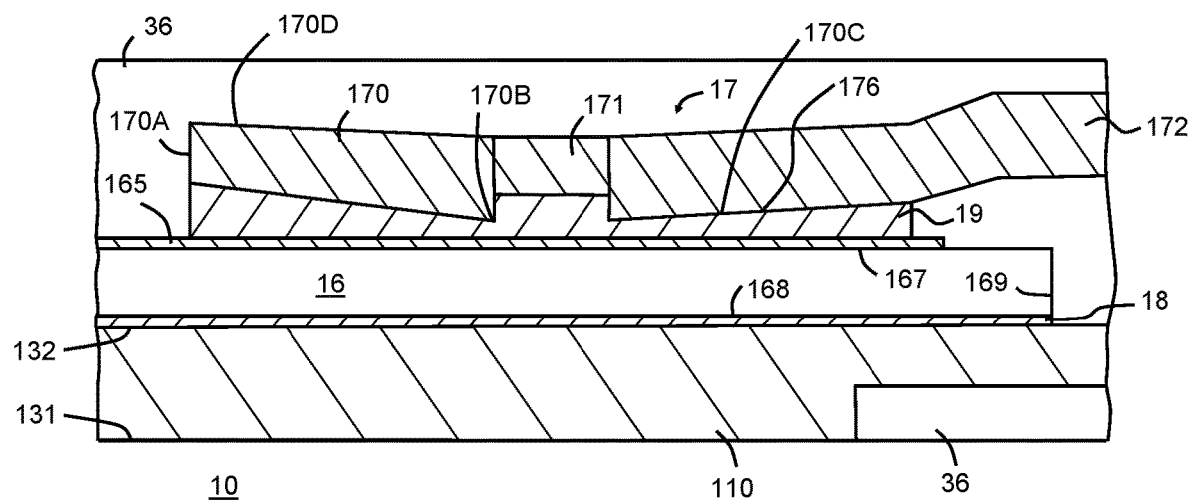
FIG. 2A illustrates a partial cross-sectional view of the packaged electronic device of FIG. 1 taken along reference line 2A-2A.

FIG. 1 illustrates a top plan view of an example packaged electronic device structure 10, such as a packaged semiconductor device 10 in accordance with the present description. The example is illustrated as a power SO8 or SON type packaged semiconductor device structure, but the description is not limited to this type of package and is suitable for other types of packages. FIG. 2A illustrates a partial cross-sectional view of packaged electronic device structure 10 taken along reference line 2A-2A of FIG. 1. In the example presented in FIG. 1, packaged electronic device structure 10 comprises a substrate 11, which can include a die pad 110 and conductive leads 112; an electronic component 16, such as an electronic device 16, semiconductor die 16, or a semiconductor device 16; a conductive clip structure 17 or conductive clip 17; a conductive interconnect structure 21; and an enclosure structure 36, such as a package body 36. Package body 36 is presented in FIG. 1 as transparent to disclose the internal contents of packaged electronic device structure 10. In the present example and as presented in FIG. 2A, semiconductor device 16 is attached to die pad 11 with an attachment material 18 and conductive clip 17 is attached to semiconductor device 16 and one or more conductive leads 112 with an attachment material 19. Conductive interconnect structure 21 electrically connects another portion of semiconductor device 16 to another one of conductive leads 112.

Substrate 11, conductive clip 17, conductive interconnect structure 21, and package body 36 can be referred to as a semiconductor package 190, and semiconductor package 190 can provide protection for portions semiconductor device 16 from external elements and/or environmental exposure. In addition, semiconductor package 190 can provide electrical coupling from external electrical components (not shown) to conductive clip 17, conductive interconnect structure 21, and semiconductor device 16.

As presented in FIGS. 1 and 2A, substrate 11 can comprise a leadframe 11 having die pad 110 and conductive leads 112 spaced apart from die pad 110. In some examples, conductive leads 112 are disposed along one side of die pad 110. In other examples, conductive leads 112 can be disposed along more than one side of die pad 110. Die pad 110 has a die pad top side or surface 132 and an opposing die pad bottom side or surface 131. In addition, each conductive lead 112 has a lead top side or surface and an opposing lead bottom side or surface. In some examples, substrate 11 comprises a conductive material. In some examples, substrate 11 is a copper-based leadframe (for example, a leadframe comprising copper/iron/phosphorous; 99.8/0.01/0.025), a copper alloy-based leadframe (for example, a leadframe comprising copper/chromium/tin/zinc; 99.0/0.25/0.22), or an alloy 42-based leadframe (for example, a leadframe comprising iron/nickel; 58.0/42.0). In other examples, substrate 11 can comprise other conductive or non-conductive materials, which may be further plated (in whole or in part) with one or more conductive layers.

In the present example, semiconductor device 16 is mounted adjacent to or atop die pad top side 132 of die pad 110 using attachment material 18, which can comprise a thermally conductive and electrically conductive material, or a thermally conductive and electrically non-conductive material. In some examples, attachment material 18 comprises an epoxy-type die attach material. In other examples, attachment material 18 can be a solder material, such as a solder paste or other materials as known to one of ordinary skill in the art. Attachment material 18 typically functions to both provide mechanical fixation of semiconductor device 16 to die pad 110 and to dissipate heat generated by semiconductor device 16. In some examples, attachment material 18 can provide an electrical path from die pad 110 to semiconductor device 16.

Semiconductor device 16 or semiconductor die 16 includes a device or die top side 167, an opposing device or bottom side 168, and a device or die sidewall 169 located between device top side 167 and device bottom side 168. In the present embodiment, die sidewall 169 defines a die perimeter for semiconductor device 16. In some examples, device top side 167 can be defined by a conductive layer 165. In other examples, device top side 167 can be defined by one or more dielectric layers and one or more conductive layers, which are interconnected to device regions (not shown) disposed within and/or on semiconductor device 16. In some examples, device bottom side 168 can be defined by a conductive layer (not shown). Semiconductor device 16 can be a power semiconductor device, such as a metal-oxide-semiconductor field-effect transistor (MOSFET) device, an insulated gate bipolar transistor (IGBT) device, a bipolar transistor device, a diode device, other power devices, or other semiconductor devices as known to those of ordinary skilled in the art. In the present example, semiconductor device 16 is illustrated as an MOSFET device and conductive layer 165 can be configured as a current carrying electrode, such as a source electrode. Semiconductor device 16 can further include a control electrode 24 electrically connected to at least one of conductive leads 112 using conductive connective structure 21, such as a conductive wire 21 (illustrated, for example, in FIG. 1) provided using, for example, wire bonding techniques. Conductive wire 21 can comprise copper, gold, aluminum, or other conductive materials as known to one of ordinary skill in the art. In other examples, conductive connective structure 21 can comprise a ribbon bond or other connective structures as known to one of ordinary skill in the art. Conductive connect structure 21 functions to transmit electrical signals to and from semiconductor device 16.

Conductive clip 17 is attached adjacent to, atop, or to device top side 167 of semiconductor device 16 using attachment material 19, which comprises a conductive material. In some examples, attachment material 19 is a conductive solder, such as a solder paste, which can be a blend of micro-fine spherical solder powder, flux, and a binder. Conductive clip 17 can comprise copper, a copper alloy, or other materials known to those skilled in the art. Conductive clip 17 comprises a plate portion 170, a first portion 170, or a clip top portion 170, and a clip tail portion 172, a second portion 172, or clip connecting portion 172 connected to plate portion 170. Clip connecting portion 172 is configured to connect to one or more of conductive leads 112 to provide for an electrical connection between semiconductor device 16 and the one or more conductive leads 112. In some examples, plate portion 170 and clip connecting portion 172 are an integrated structure formed from a single piece of conductive material.

In accordance with the present description and the present example, conductive clip 17 comprises through-holes 171 disposed through plate portion 170 of conductive clip 17. As illustrated in FIG. 2A, a lower surface 170C or lower side 170C of plate portion 170 further comprises a sloped profile 176, a sloped shape 176 including a convex shape 176, or a bowed shape 176 in a first cross-sectional view 101 that is generally parallel to the direction that conductive leads 112 extend away from die pad 110. In some examples, sloped profile 176 is configured such that an outer section of sloped profile 176 towards one or more edge portions 170A of plate portion 170 is vertically spaced away from top side 167 of semiconductor device 16 further than an inner section of sloped profile 176 towards center portion 170B of plate portion 170. In some examples, a top surface 170D or top side 170D of plate portion 170 can follow or can be similar to the profile of lower side 170C in one or both of the cross-sectional views 101 and 201. In other examples, top side 170D can have a flat profile in both cross-sectional views 101 and 201.

In accordance with the present description, the configuration of plate portion 170 promotes an increase in the amount of attachment material 19 or solder material 19 between plate portion 170 and semiconductor device 16 thereby improving bond strength. In addition, during the process to reflow attachment material 19, the configuration of plate portion 170 promotes the removal of gas(es) from between plate portion 170 and semiconductor device 16 thereby improving solder wettability and reducing solder voids. Further, conductive material 19 flows into through-holes 171 during processing thereby providing an anchoring effect for conductive clip 17. Moreover, the configuration of plate portion 170 further reduces the overflow of conductive material 19 from the connection area thereby reducing the possibility of electrical shorting issues. The above effects improve the yields and reliability of packaged electronic device structure 10.

In some examples, conductive clip 17 further includes one or more bump structures 15, which can protrude outward from lower side 170C of plate portion 170 towards die top side 167 of semiconductor device 16. Bump structure 15 functions as a stand-off or spacer to provide a vertical gap between semiconductor device 16 and plate portion 170 of conductive clip 17. In some examples, a portion of attachment material 19 can be disposed on a lower surface of bump structure 15 and semiconductor device 16.

In some examples, package body 36 encapsulates semiconductor device 16, conductive clip 17, conductive connective structure 21, and at least portions of substrate 11. In the present example, portions of conductive leads 112 are exposed to the outside of package body 36 to facilitate electrical connections to a next level of assembly, such as a printed circuit board. In some examples, die pad bottom side 131 of die pad 110 can also be exposed to the outside of package body 36 as presented in FIG. 2A. In some examples, package body 36 can be polymer based composite material, such as epoxy resin with filler, epoxy acrylate with filler, or polymer with proper filler. Package body 36 comprises a non-conductive and environmentally protective material that protects conductive clip 17, conductive interconnect structure 21, and semiconductor device 16 from external elements and contaminants. Package body 36 may be formed using paste printing, compressive molding, transfer molding, over-molding, liquid encapsulant molding, vacuum lamination, other suitable applicator, or other processes as known to those of skill in the art. In some embodiments, package body 36 is an epoxy mold compound ("EMC") and can be formed using transfer or injection molding techniques.

Figure 2B:
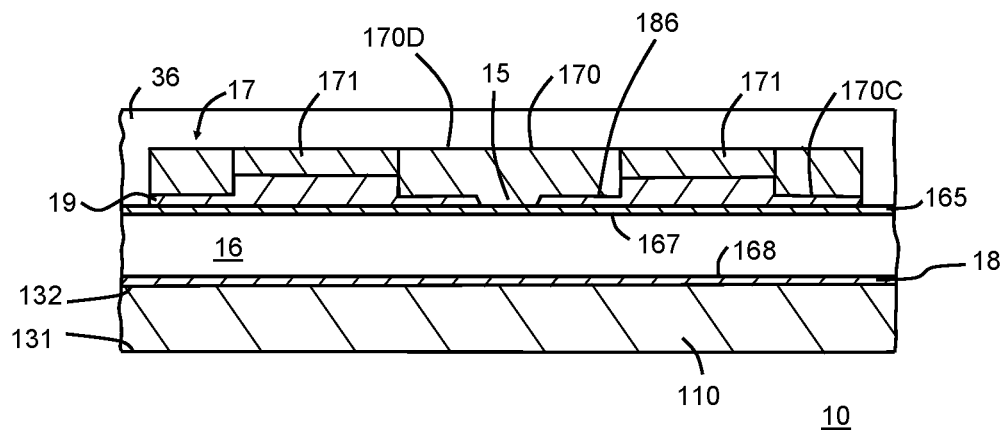
FIG. 2B illustrates a partial cross-sectional view of the packaged electronic device of FIG. 1 taken along reference line 2'-2' in accordance with a first example.

FIG. 2B illustrates a partial cross-sectional of package electronic device 10 taken along reference line 2'-2' of FIG. 1 in accordance with a first example. In the example presented in FIG. 2B, lower side 170C of plate portion 170 comprises a substantially flat profile 186 in a second cross-sectional view 201 that is generally perpendicular to the direction that conductive leads 112 extend away from die pad 110. That is, in the example of FIGS. 2A and 2B, lower side 170C of plate portion 170 comprises a sloped profile 176 in the first cross-section view 101 as presented in FIG. 2A and comprises a generally flat profile 186 in the second cross-sectional view 201 of FIG. 2B. In some examples of packaged electronic device structure 10, top side 170D of plate portion 170 can follow or can be similar to the profile of lower side 170C in one or both of the cross-sectional views 101 and 201.

Figure 2C:
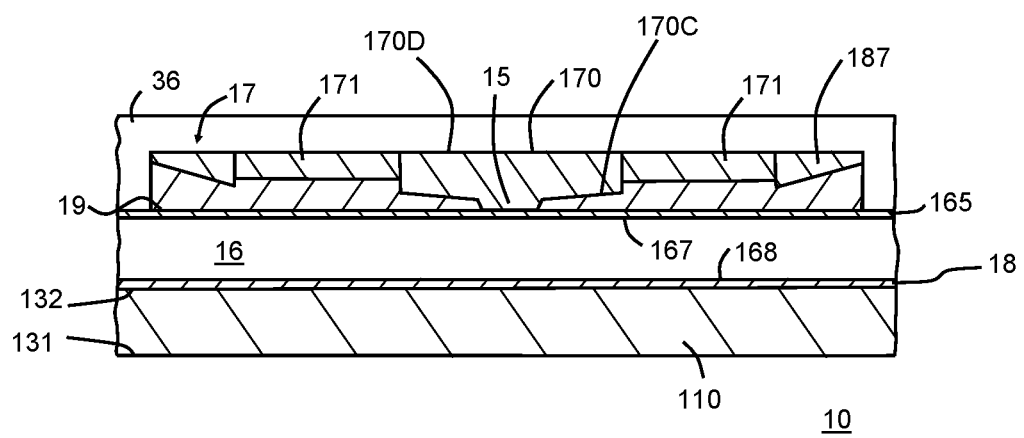
FIG. 2C illustrates a partial cross-sectional view of the package electronic device of FIG. 1 taken along reference line 2'-2' in accordance with a second example.

FIG. 2C illustrates a partial cross-sectional view of packaged electronic device structure 10 taken along reference line 2'-2' of FIG. 1 in accordance with a second example. In the example presented in FIG. 2C, lower side 170C of plate portion 170 comprises a sloped profile 187 in the second cross-section view 201. That is, in the example of FIGS. 2A and 2C, lower side 170C of plate portion 170 comprises a sloped profile 176 in the first cross-section view 101 as presented in FIG. 2A and comprises a sloped profile 187 in the second cross-sectional view 201 of FIG. 2C. In some examples, sloped profile 187 can be similar to sloped provide 176. In some examples of packaged electronic device structure 10, top side 170D of plate portion 170 can follow or can be similar to the profile of lower side 170C in one or both of the cross-sectional views 101 and 201.

Figure 3:
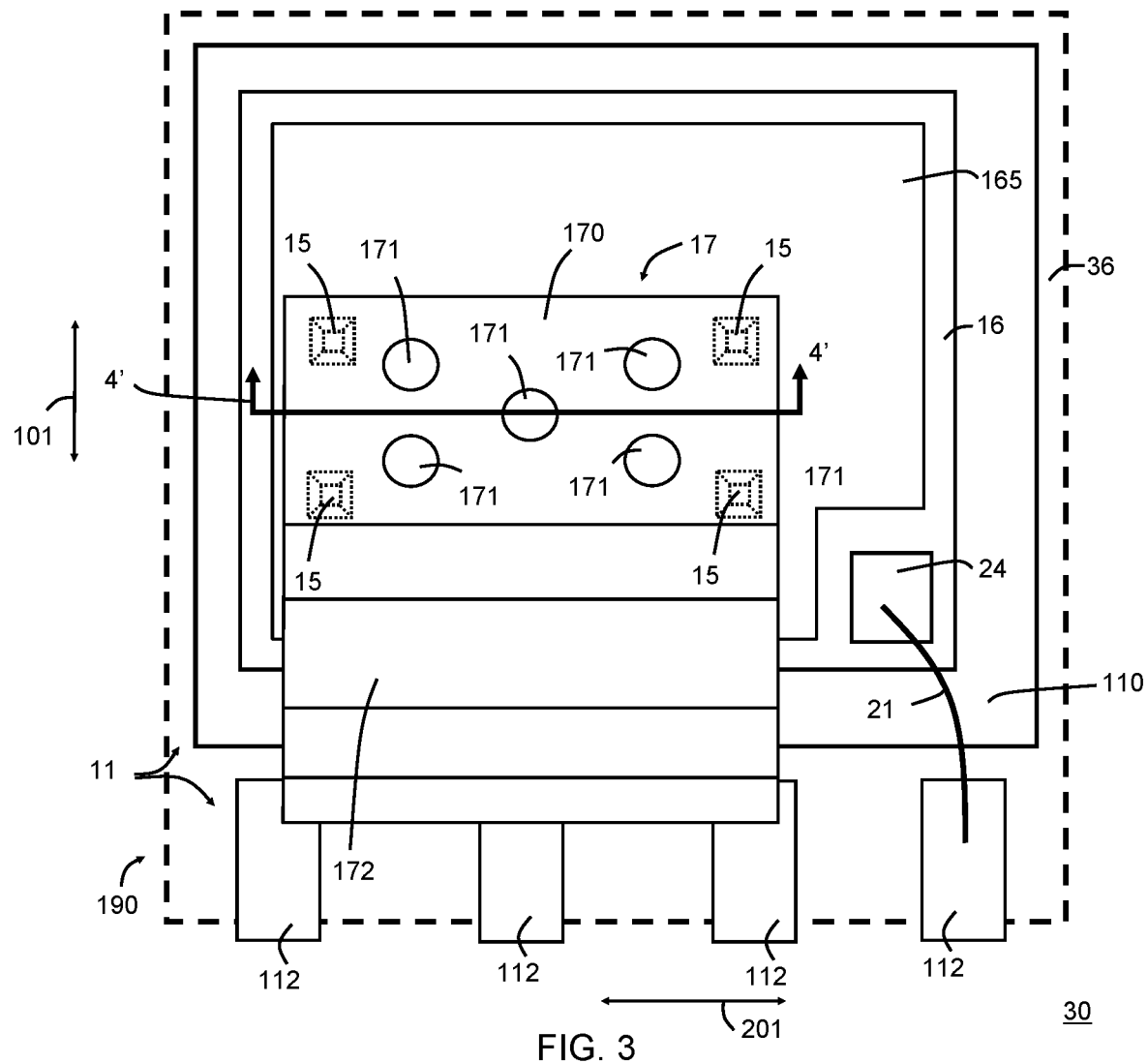
FIG. 3 illustrates a top plan view of a packaged electronic device of the present description.
Figure 4:
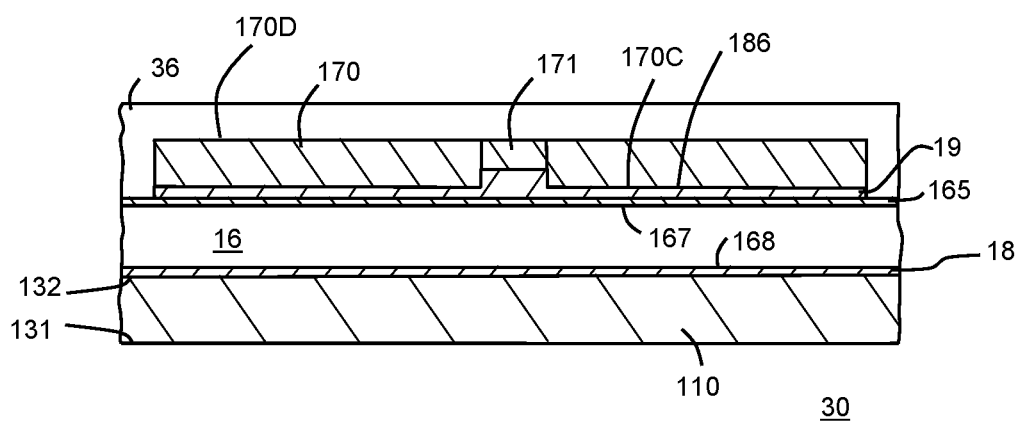
FIG. 4 illustrates a partial cross-sectional view of the packaged electronic device of FIG. 3 taken along reference line 4'-4'.

FIG. 3 illustrates a top plan view of an example packaged electronic device structure 30, such as a packaged semiconductor device 30 in accordance with the present description. FIG. 4 illustrates a partial cross-sectional view of packaged electronic device structure 30 taken along reference line 4'-4' of FIG. 3. Packaged electronic device structure 30 is similar in some respects to packaged electronic device structure 10, and only the differences will be presented herein. In some examples, plate portion 170 comprises a plurality of through-holes 171 distributed in columns where adjacent columns can be provided in an offset configuration. In some examples, through-holes 171 are rounded in shape and can have similar or different diameters with respect to each other. As presented in FIG. 3, plate portion 170 is further provided with a plurality of bump structures 15 that are proximate to edges of plate portion 170. In some examples, through-holes 171 are distributed inward from bump structures 15 as generally illustrated in FIG. 3. As presented in FIG. 4, in some examples lower side 170C plate portion 170 comprises substantially flat profile 186 in the second cross-sectional view 201. In some examples, lower side 170C of plate portion 170 can have sloped profile 187 as presented in FIG. 2C in the second cross-sectional view 201. In other examples, conductive plate 170 can have sloped profile 176 in the first cross-sectional view 101 as presented in FIG. 2A. In some examples of packaged electronic device structure 30, top side 170D of plate portion 170 can follow or can be similar to the profile of lower side 170C in one or both of the cross-sectional views 101 and 201. The features of conductive clip 17 of packaged electronic device structure 30 have similar benefits as described previously with packaged electronic device structure 10.

Figure 5:
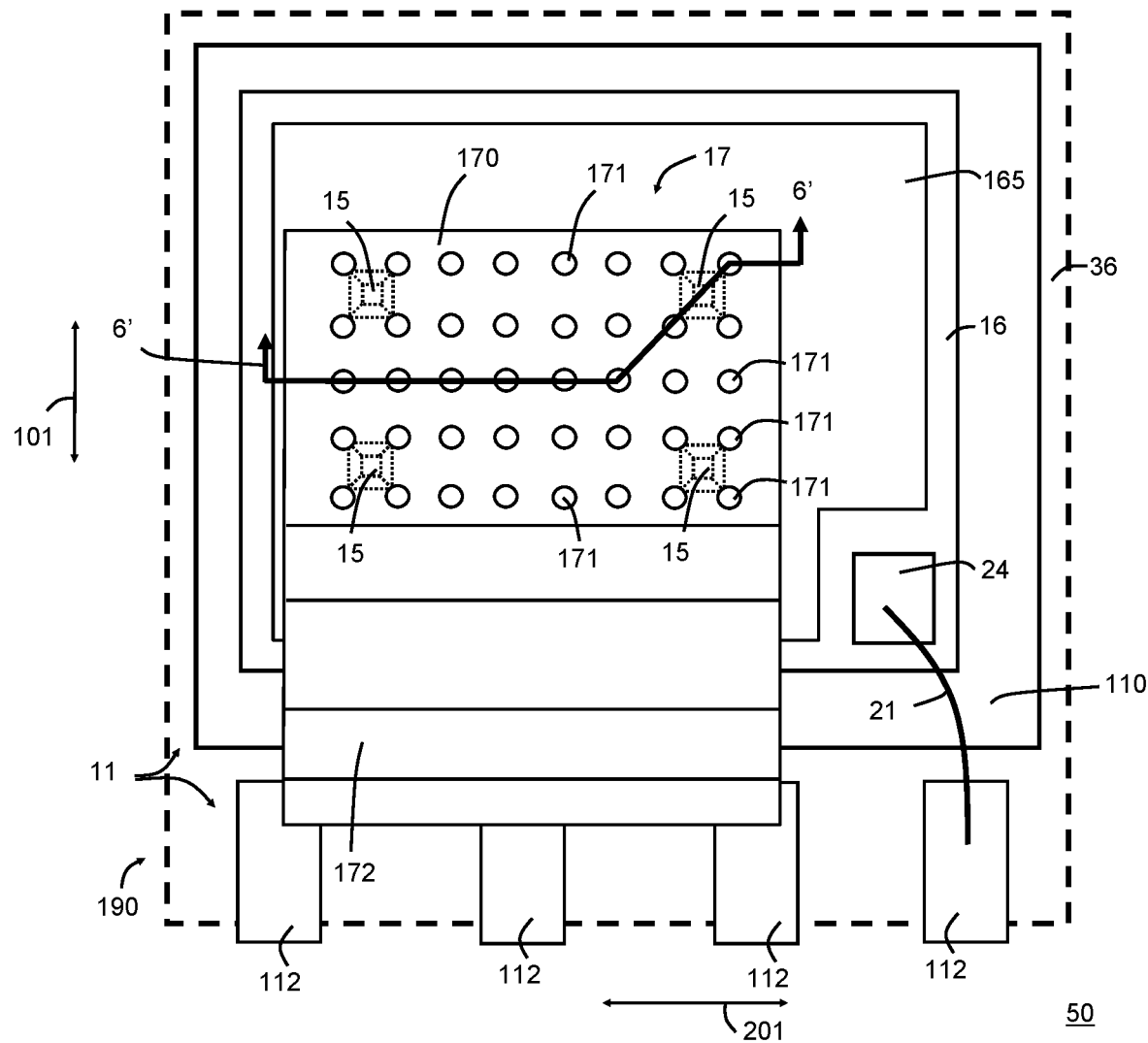
FIG. 5 illustrates a top plan view of a packaged electronic device of the present description.
Figure 6:
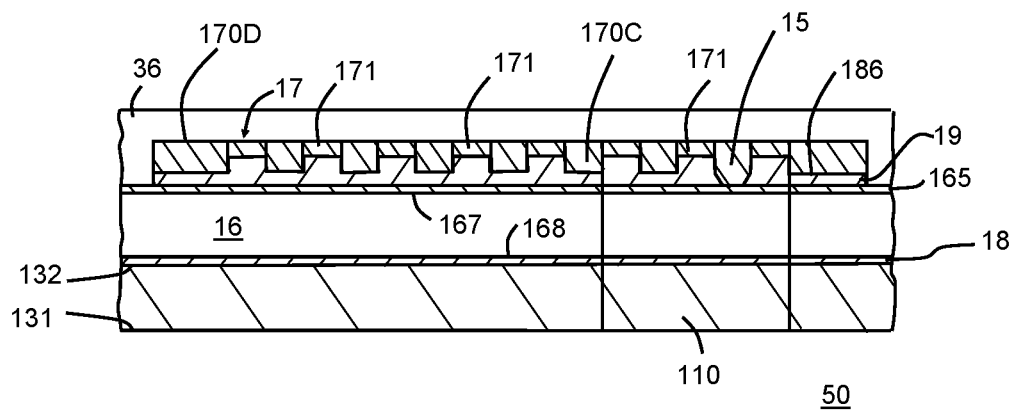
FIG. 6 illustrates a partial cross-sectional view of the packaged electronic device of FIG. 5 taken along reference line 6'-6'.

FIG. 5 illustrates a top plan view of an example packaged electronic device structure 50, such as a packaged semiconductor device 50 in accordance with the present description. FIG. 6 illustrates a partial cross-sectional view of packaged electronic device structure 50 taken along reference line 6'-6' of FIG. 5. Packaged electronic device structure 50 is similar in some respects to packaged electronic device structure 10, and only the differences will be presented herein. In some examples, plate portion 170 comprises a plurality of through-holes 171 distributed in an N×M matrix configuration, such as the 5×8 matrix presented in FIG. 5. In some examples, through-holes 171 are rounded in shape and can have similar or different diameters with respect to each other. As presented in FIG. 5, plate portion 170 is further provided with a plurality of bump structures 15 that are proximate to edges of plate portion 170. In some examples, through-holes 171 are distributed inward from bump structure 15 as generally illustrated in FIG. 5. In accordance with the present description, some of through-holes 171 are disposed so as to enclose portions of each bump structure 15 as generally illustrated in FIG. 5. Here, through-holes 171 can be deposed proximate to four corners of each bump structure 15. As presented in FIG. 6, in some examples plate portion 170 comprises substantially flat profile 186 in the second cross-sectional view 201. In some examples, plate portion 170 can have sloped profile 187 as presented in FIG. 2C in the second cross-sectional view 201. In other examples, plate portion 170 can have sloped profile 176 in the first cross-sectional view 101 as presented in FIG. 2A. In some examples of packaged electronic device structure 50, top side 170D of plate portion 170 can follow or can be similar to the profile of lower side 170C in one or both of the cross-sectional views 101 and 201. The features of conductive clip 17 of packaged electronic device structure 50 have similar benefits as described previously with packaged electronic device structure 10.

Figure 7:
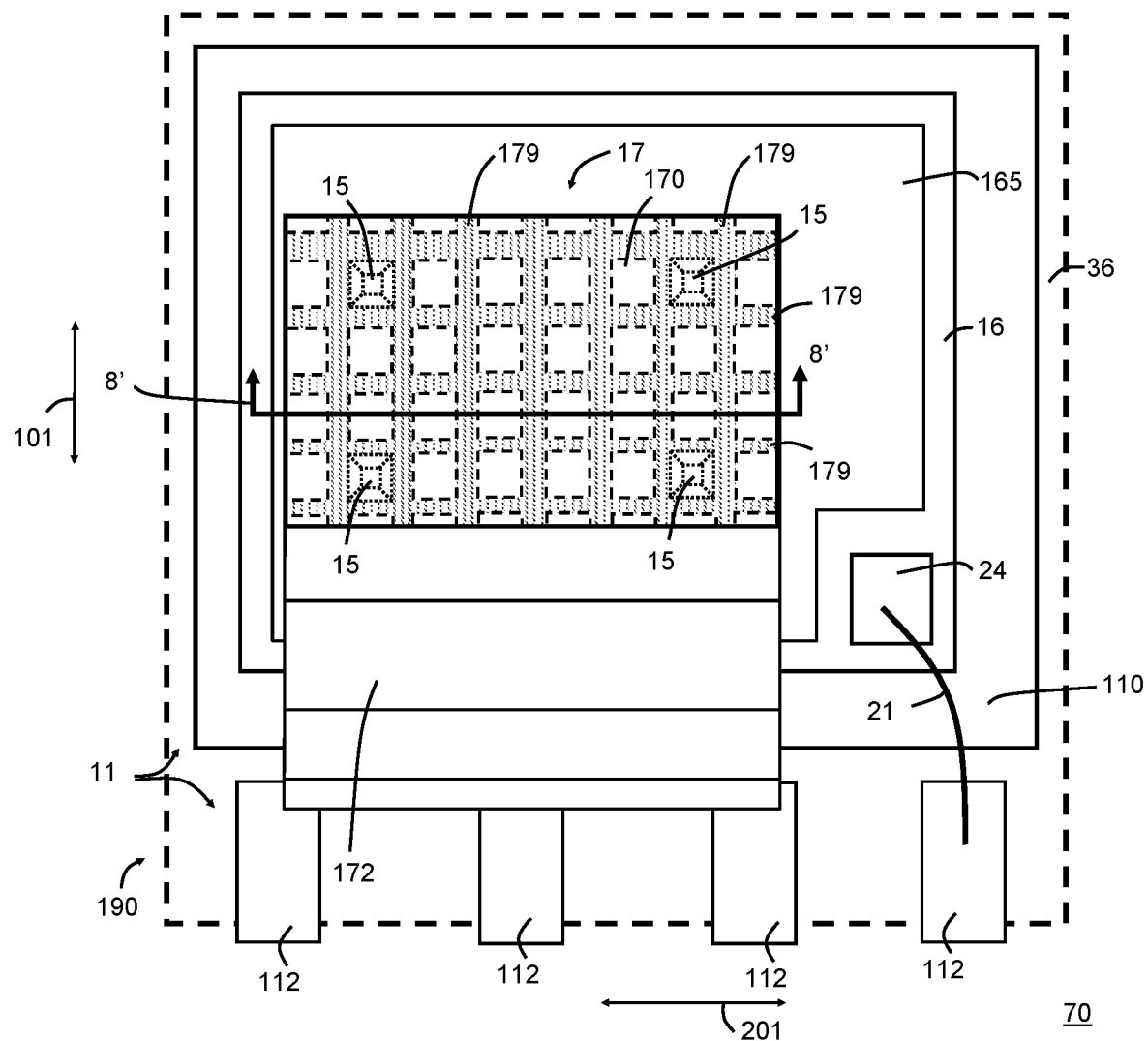
FIG. 7 illustrates a top plan view of a packaged electronic device of the present description.
Figure 8:
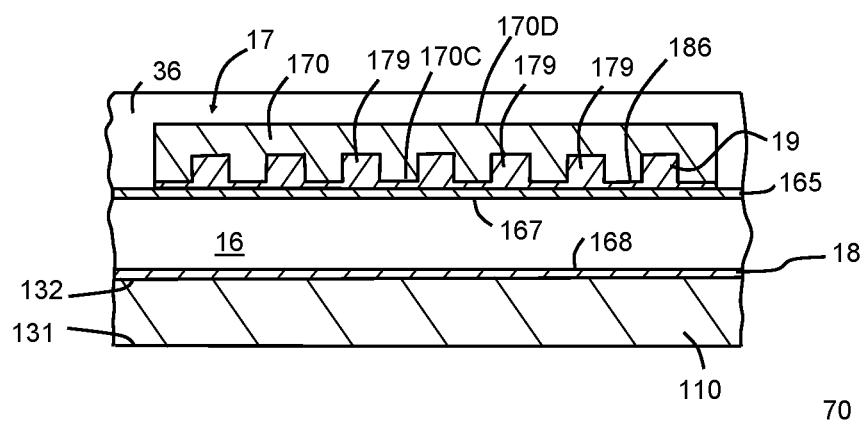
FIG. 8 illustrates a partial cross-sectional view of the packaged electronic device of FIG. 7 taken along reference line 8'-8'.

FIG. 7 illustrates a top plan view of an example packaged electronic device structure 70, such as a packaged semiconductor device 70 in accordance with the present description. FIG. 8 illustrates a partial cross-sectional view of packaged electronic device structure 70 taken along reference line 8'-8' of FIG. 7. Packaged electronic device structure 70 is similar in some respects to packaged electronic device structure 10, and only the differences will be presented herein. In the present example, plate portion 170 comprises a plurality of channels 179 that extend vertically and horizontally across plate portion 170 extending inward from lower side 170C of plate portion 170. In some examples, channels 179 do not extend all the way through plate portion 170 to provide a waffle-like pattern. As presented in FIG. 8, in some examples plate portion 170 comprises substantially flat profile 186 in the second cross-sectional view 201. In some examples, lower side 170C of plate portion 170 can have sloped profile 187 as presented in FIG. 2C in the second cross-sectional view 201. In other examples, plate portion 170 can have sloped profile 176 in the first cross-sectional view 101 as presented in FIG. 2A. In some examples of packaged electronic device structure 70, top side 170D of plate portion 170 can follow or can be similar to the profile of lower side 170C in one or both of the cross-sectional views 101 and 201. The features of conductive clip 17 of packaged electronic device structure 70 have similar benefits as described previously with packaged electronic device structure 10.

Figure 9:
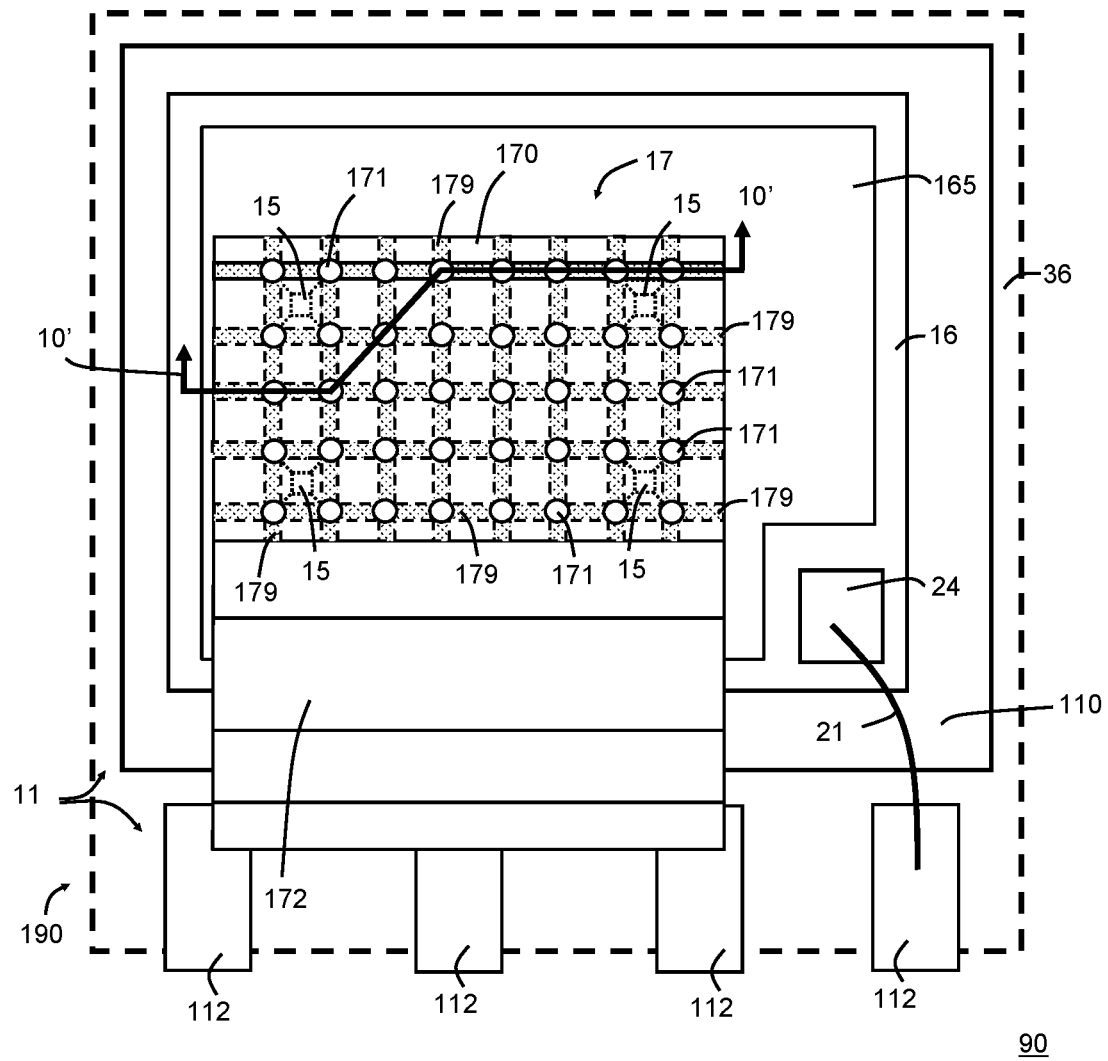
FIG. 9 illustrates a top plan view of a packaged electronic device of the present description.
Figure 10:
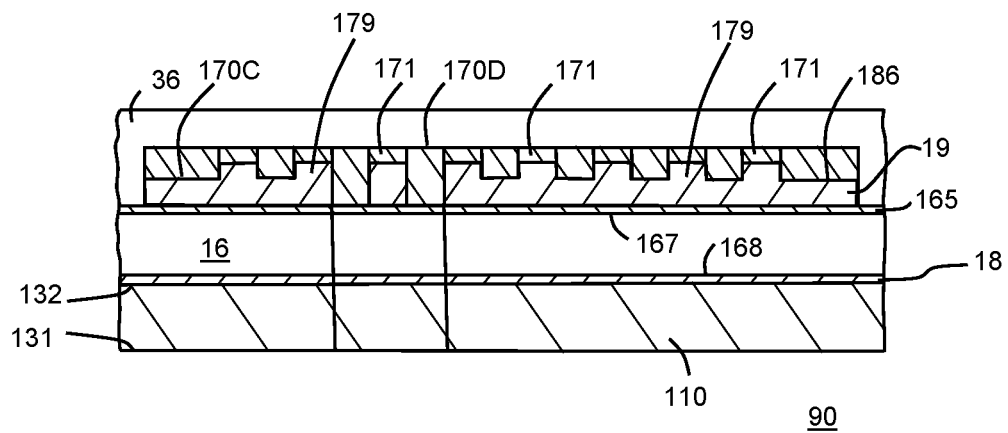
FIG. 10 illustrates a partial cross-sectional view of the packaged electronic device of FIG. 9 taken along reference line 10'-10'.

FIG. 9 illustrates a top plan view of an example packaged electronic device structure 90, such as a packaged semiconductor device 90 in accordance with the present description. FIG. 10 illustrates a partial cross-sectional view of packaged electronic device structure 90 taken along reference line 10'-10' of FIG. 9. Packaged electronic device structure 90 is similar in some respects to packaged electronic device structure 10 and packaged electronic device structure 70, and only the differences will be presented herein. In the present example, plate portion 170 comprises a plurality of channels 179 that extend vertically and horizontally across plate portion 170 extending inward from lower side 170C of plate portion 170. In addition, plate portion 170 comprises through-holes 171 disposed above some of channels 179 such that portions of channels 179 are connected to the outside through top side 170D of plate portion 170. In some examples, channels 179 do not extend all the way through plate portion 170 to provide a waffle-like pattern. In some examples, through-holes 171 are disposed above where a vertically oriented channel 179 crosses a horizontally oriented channel 179 as generally illustrated in FIG. 9.

As presented in FIG. 10, in some examples plate portion 170 comprises substantially flat profile 186 in the second cross-sectional view 201. In some examples, lower side 170A plate portion 170 can have sloped profile 187 as presented in FIG. 2C in the second cross-sectional view 201. In other examples, plate portion 170 can have sloped profile 176 in the first cross-sectional view 101 as presented in FIG. 2A. In some examples of packaged electronic device structure 90, top side 170D of plate portion 170 can follow or can be similar to the profile of lower side 170C in one or both of the cross-sectional views 101 and 201. The features of conductive clip 17 of packaged electronic device structure 90 have similar benefits as described previously with packaged electronic device structure 10.

Figure 11:
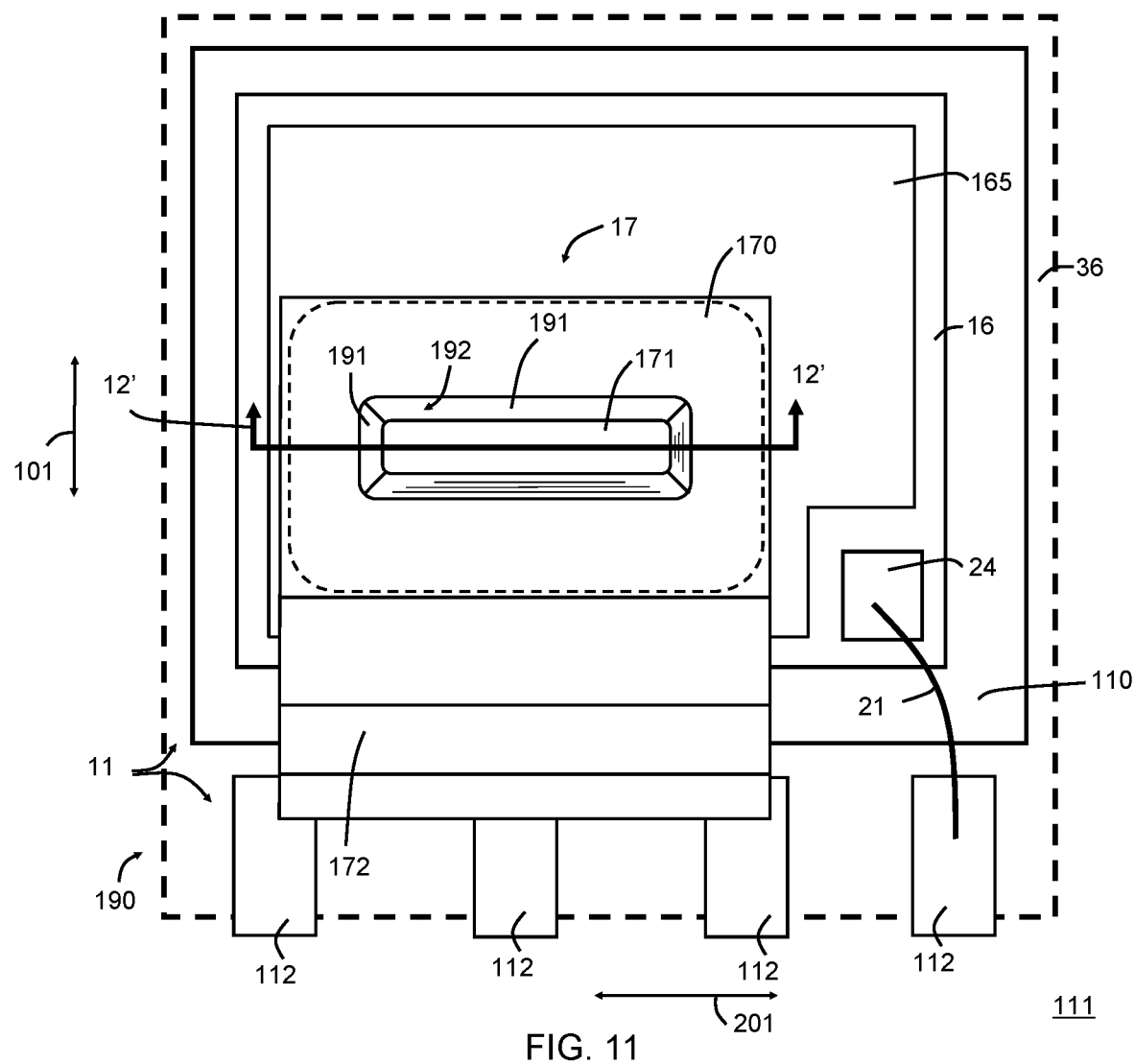
FIG. 11 illustrates a top plan view of a packaged electronic device of the present description.
Figure 12:
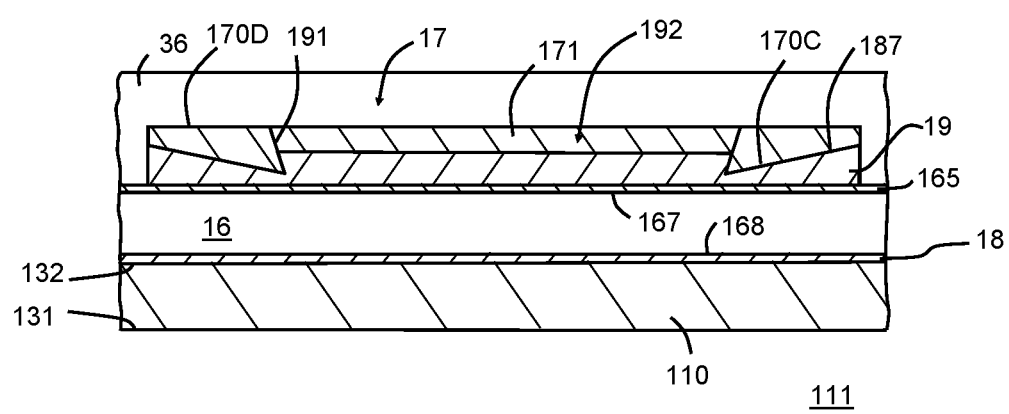
FIG. 12 illustrates a partial cross-sectional view of the packaged electronic device of FIG. 11 taken along reference line 12'-12'.

FIG. 11 illustrates a top plan view of a packaged electronic device structure 111, such as a packaged semiconductor device 111 in accordance with the present description. FIG. 12 illustrates a partial cross-sectional view of packaged electronic device structure 111 taken along reference line 12'-12' of FIG. 11. Packaged electronic device structure 111 is similar in some respects to packaged electronic device structure 10, and only the differences will be presented herein. In packaged electronic device structure 111, conductive clip 17 comprises a single through-hole 171 substantially centrally located within plate portion 170. In addition, through-hole 171 is configured having a sloped sidewall shape 191 that provides through-hole 171 with a conical shape 192. In the present example, lower side 170C of plate portion 170 comprises a sloped profile 176 in the first cross-sectional view 101 (see e.g., FIG. 2A) and a sloped profile 187 in the second cross-sectional view 102 as presented in FIG. 12.

In some examples of packaged electronic device structure 111, top side 170D of plate portion 170 can follow or can be similar to the profile of lower side 170C in one or both of the cross-sectional views 101 and 201. The features of conductive clip 17 of packaged electronic device structure 111 have similar benefits as described previously with packaged electronic device structure 10. In addition, conical shape 192 provides for further anchoring of conductive clip 17 to semiconductor device 16.

Figure 13:
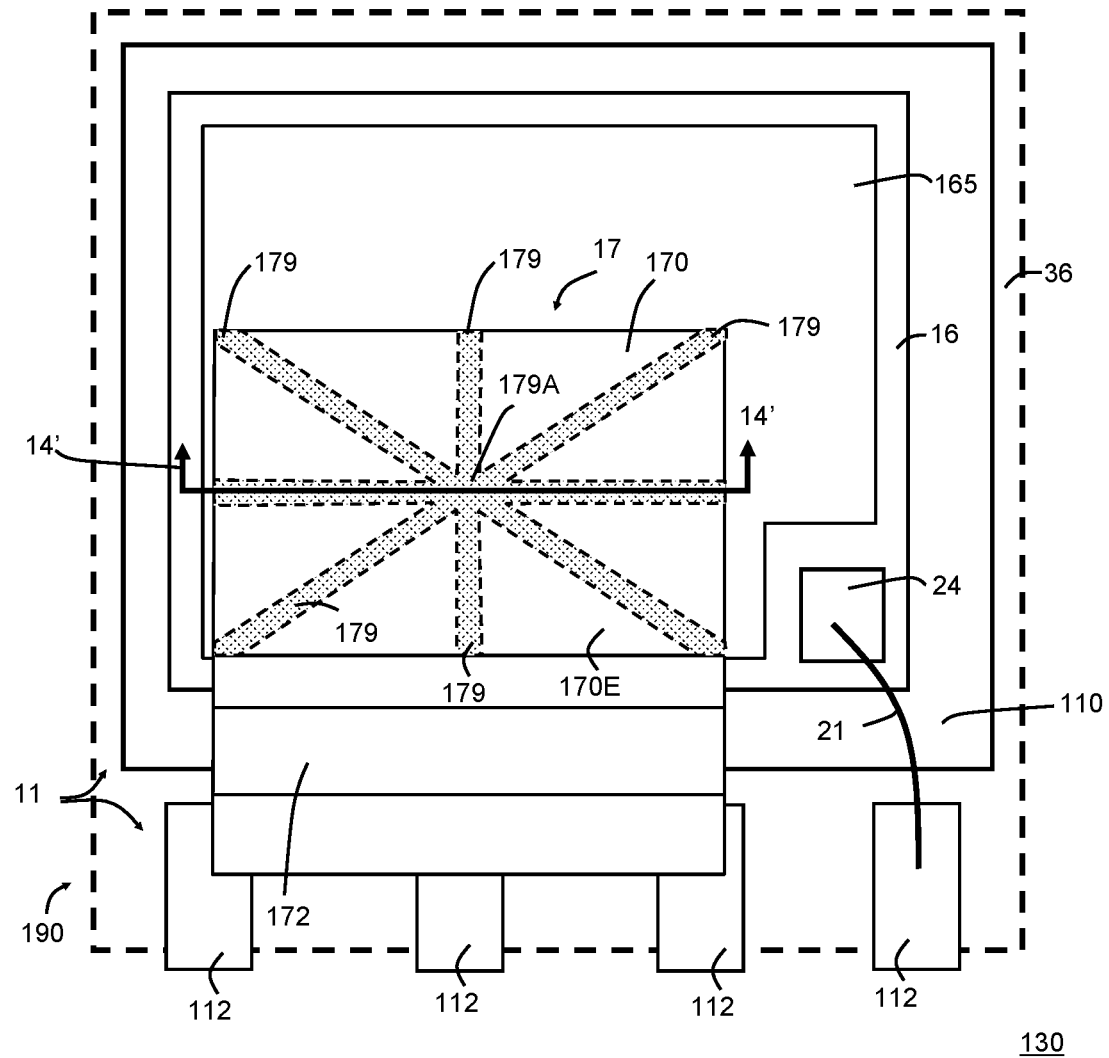
FIG. 13 illustrates a top plan view of a packaged electronic device of the present description.
Figure 14:
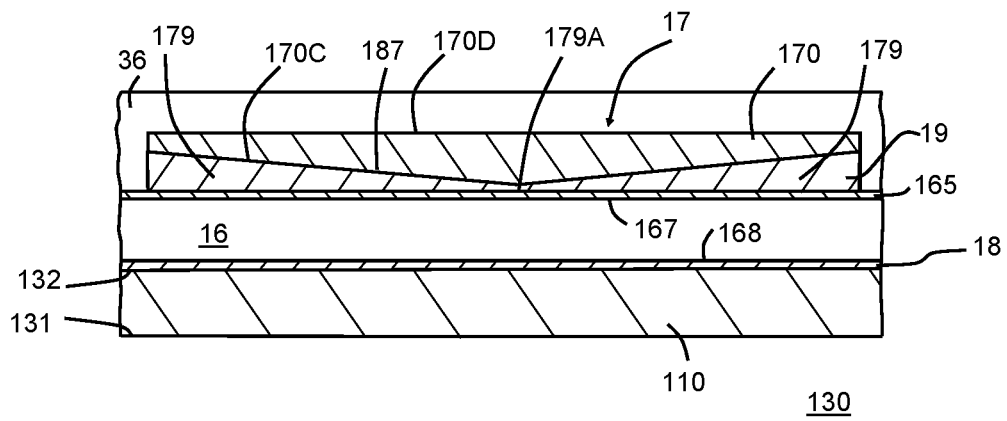
FIG. 14 illustrates a partial cross-sectional view of the packaged electronic device of FIG. 13 taken along reference line 14'-14'.

FIG. 13 illustrates a top plan view of a packaged electronic device structure 130, such as a packaged semiconductor device 130 in accordance with the present description. FIG. 14 illustrates a partial cross-sectional view of packaged electronic device structure 130 taken along reference line 14'-14' of FIG. 13. Packaged electronic device structure 130 is similar in some respects to packaged electronic device structure 10 and package electronic structure device 70, and only the differences will be presented herein. In the present example, conductive clip 17 comprises a plurality of channels 179 extending inward from lower side 170C of plate portion 170. In some examples, the plurality of channels 179 comprises a star-like pattern with all channels 179 meeting in a substantially centrally located portion 179A. In some examples, a first portion of lower side 170C of plate portion defines the top or upper surface of the plurality of channels 179 and comprises sloped profile 187 as presented in FIG. 14. Portions 170E of plate portion 170 are disposed between the plurality of channels 179 and a second portion of lower sides 170C of portions 170E can comprise substantially flat profile 186 as presented, for example, in FIG. 2B. Although eight channels 179 are presented in FIG. 13, it is understood that a larger or smaller number of channels 179 can be used. The features of conductive clip 17 of packaged electronic device structure 130 have similar benefits as described previously with packaged electronic device structure 10.

Figure 15:
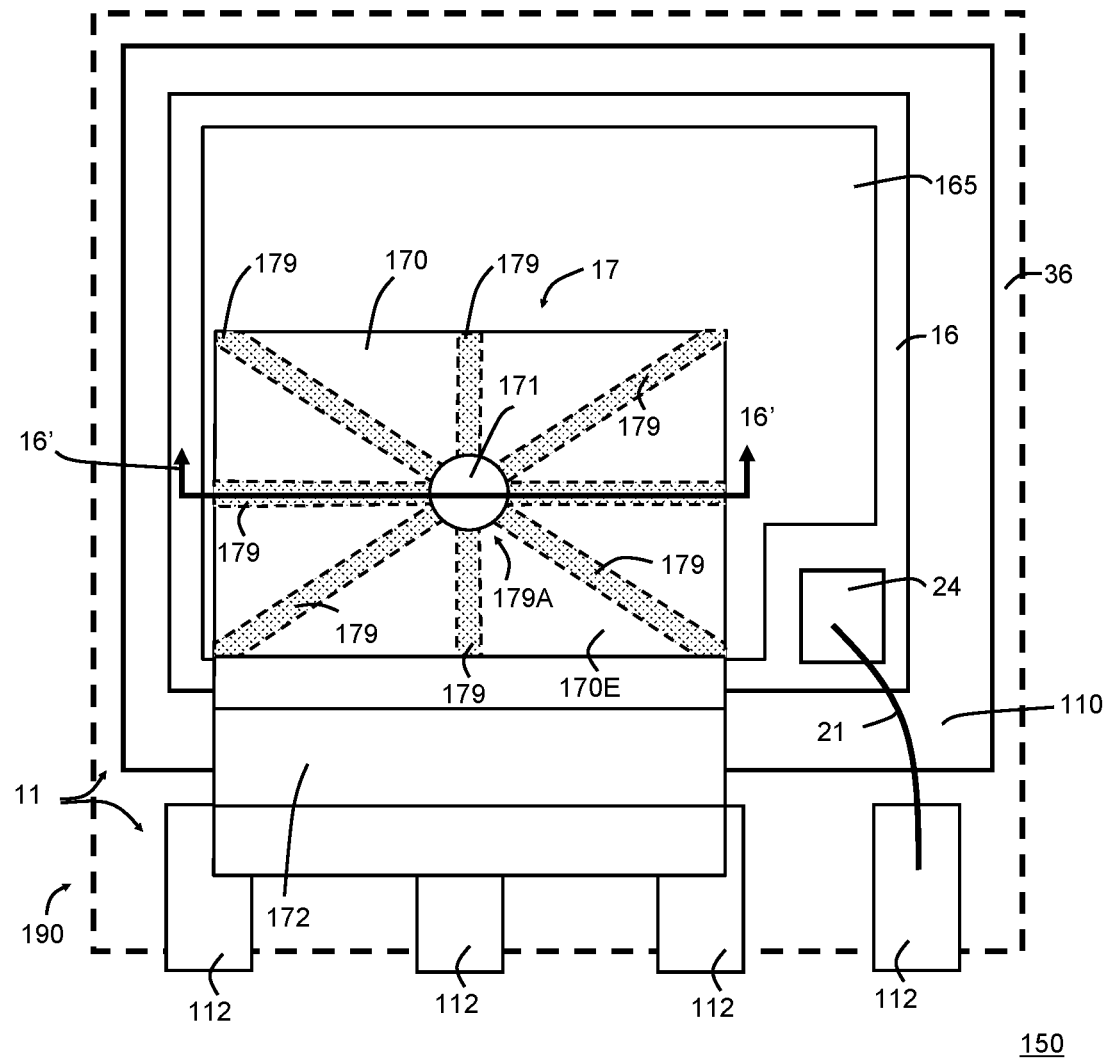
FIG. 15 illustrates a top plan view of a packaged electronic device of the present description.
Figure 16:
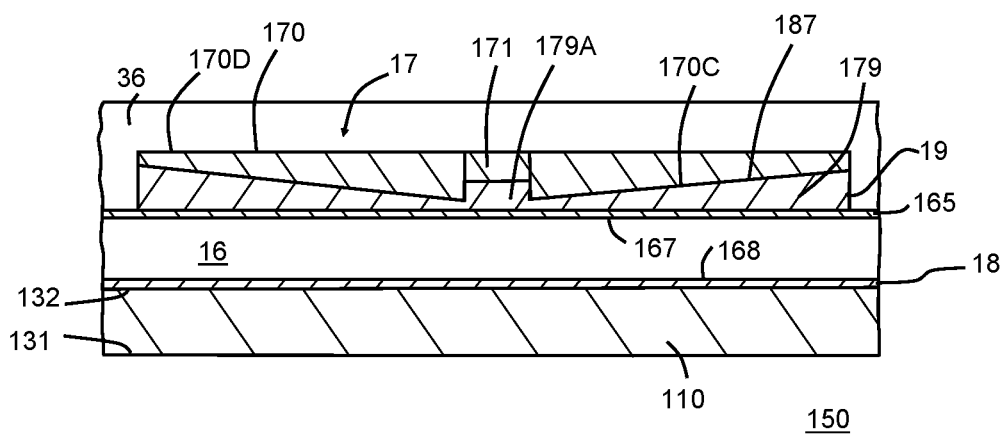
FIG. 16 illustrates a partial cross-sectional view of the packaged electronic device of FIG. 15 taken along reference line 16'-16'.

FIG. 15 illustrates a top plan view of a packaged electronic device structure 150, such as a packaged semiconductor device 150 in accordance with the present description. FIG. 16 illustrates a partial cross-sectional view of packaged electronic device structure 150 taken along reference line 16'-16' of FIG. 15. Packaged electronic device structure 150 is similar in some respects to packaged electronic device structure 10 and package electronic device structure 130, and only the differences will be presented herein. In the present example, conductive clip 17 further comprises a through-hole 171 disposed above portion 179A of plate portion 170 where channels 179 meet. The features of conductive clip 17 of packaged electronic device structure 150 have similar benefits as described previously with packaged electronic device structure 10.

Figure 17:
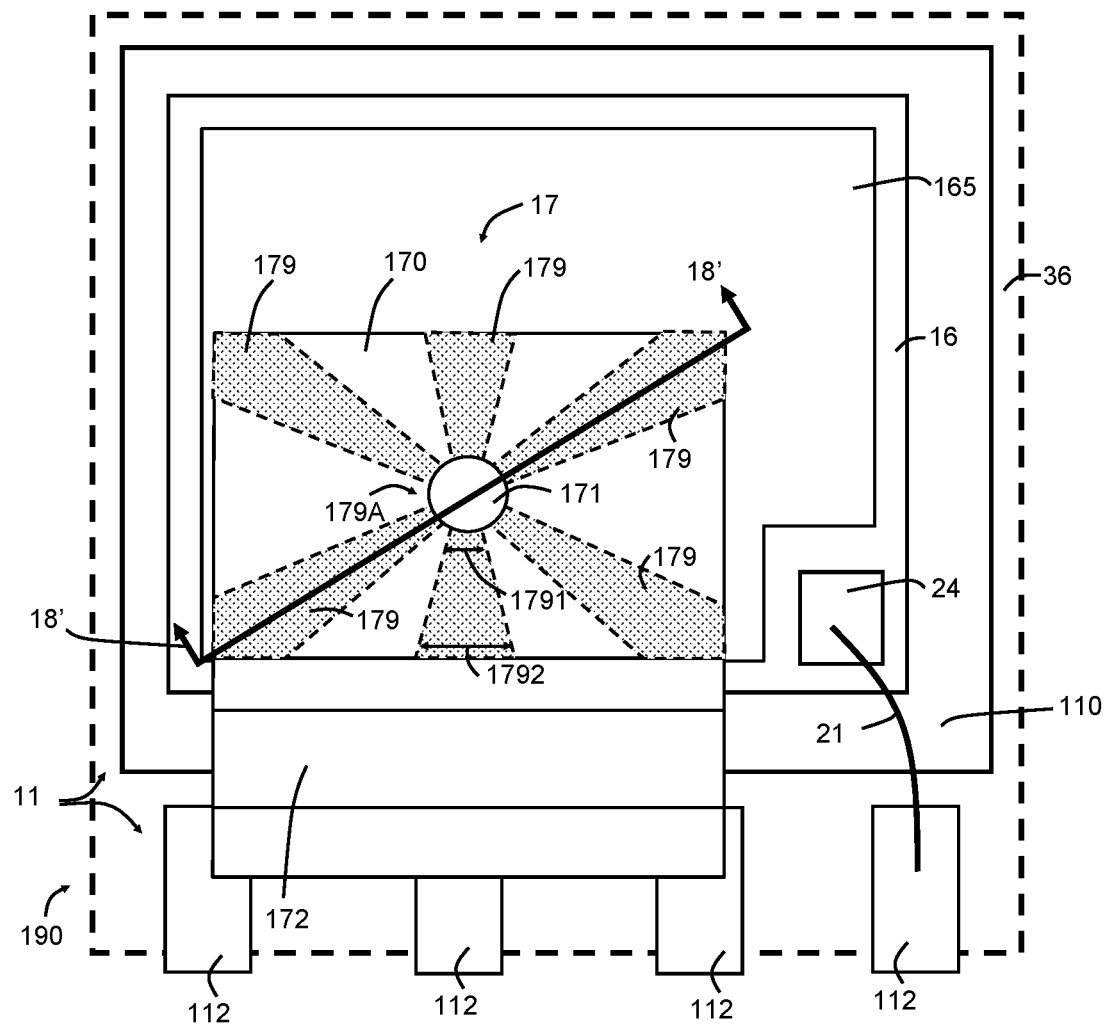
FIG. 17 illustrates a top plan view of a packaged electronic device of the present description.
Figure 18:
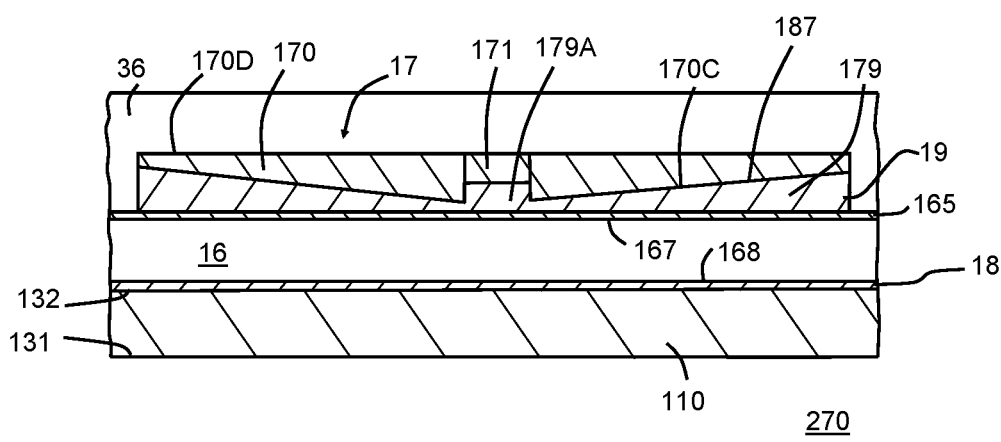
FIG. 18 illustrates a partial cross-sectional view of the packaged electronic device of FIG. 17 taken along reference line 18'-18'.

FIG. 17 illustrates a top plan view of a packaged electronic device structure 270, such as a packaged semiconductor device 270. FIG. 18 illustrates a partial cross-sectional view of packaged electronic device structure 270 taken along reference line 18'-18' of FIG. 17. Packaged electronic device structure 270 is similar in some respects to packaged electronic device structure 150, packaged electronic device structure 130, and packaged electronic device structure 10, and only the differences will be presented herein. In the present example, channels 179A comprise a shape in the top plan view that fans-out from through-hole 171 to the edges of plate portion 170. More particularly, each channel 179 has a width 1791 proximate to through-hole 171 that is smaller than a width 1792 proximate to edges of plate portion 170. The features of conductive clip 17 of packaged electronic device structure 270 have similar benefits as described previously with packaged electronic device structure 10.

Figure 19:
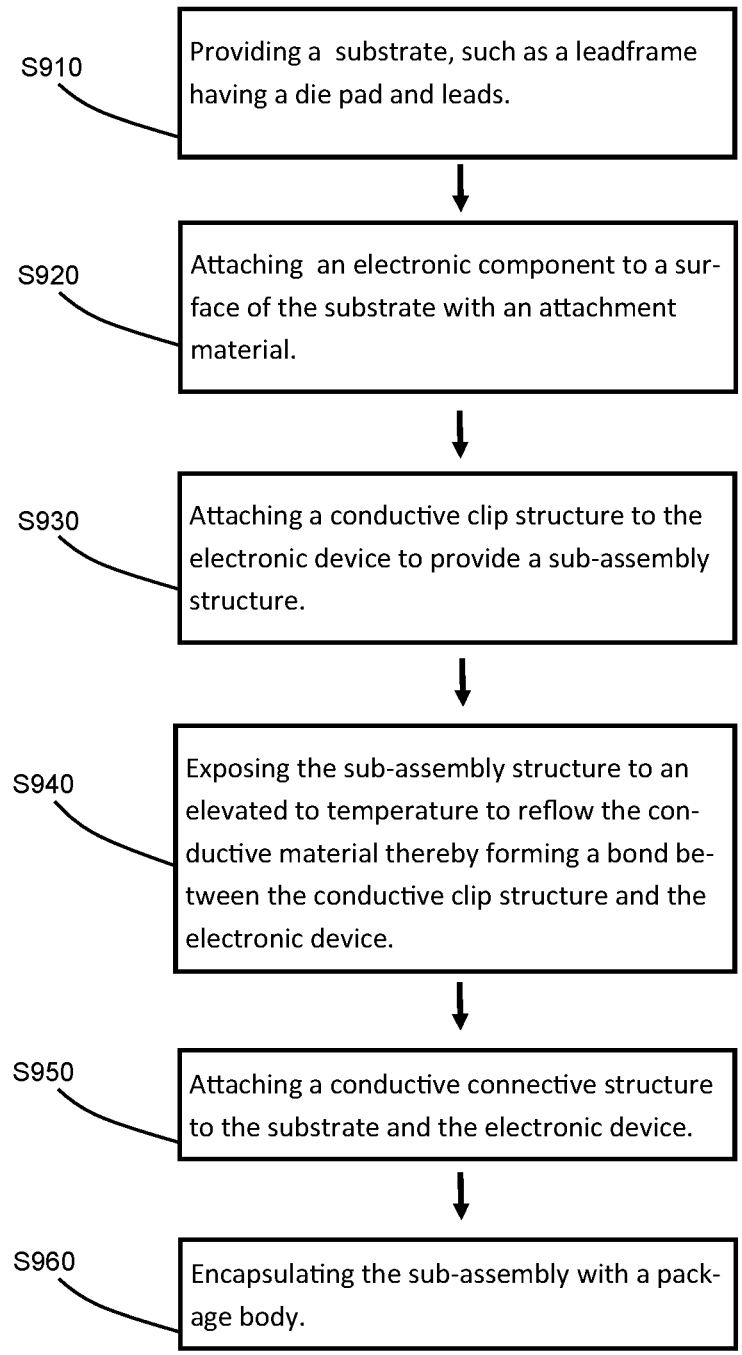
FIG. 19 is a flow chart illustrating an example method 900 for manufacturing packaged electronic device structures in accordance with the present description.

FIG. 19 is a flow chart illustrating an example method 900 for manufacturing packaged electronic device structures in accordance with the present description. In some examples, the packaged electronic device structures of method 900 can be similar to one or more of packaged electronic device structures 10, 30, 50, 70, 90, 111, 130, and/or 270 as presented in FIGS. 1-18 herein, or variations or combinations thereof.

Block S910 of method 900 comprises providing a substrate, such as a leadframe having a die pad and leads. For instance, the substrate can be similar to substrate 11 having die pad 110 and conductive leads 112 as presented in FIGS. 1-18. In some examples, the substrate is a copper-based leadframe (for example, a leadframe comprising copper/iron/phosphorous; 99.8/0.01/0.025), a copper alloy-based leadframe (for example, a leadframe comprising copper/chromium/tin/zinc; 99.0/0.25/0.22), or an alloy 42-based leadframe (for example, a leadframe comprising iron/nickel; 58.0/42.0). In other examples, the substrate can comprise other conductive or non-conductive materials, which may be further plated (in whole or in part) with one or more conductive layers. The substrate can be formed using masking and etching techniques, stamping techniques, or other techniques as known to one of ordinary skill in the art.

Block S920 of method 900 comprises attaching an electronic component to a surface of the substrate with an attachment material. For instance, the electronic component can be similar to semiconductor device 16, which can be attached to a die pad top side 132 of die pad 110 with attachment material 18 as presented in FIGS. 1-18. The attachment material can comprise a thermally conductive and electrically conductive material, or a thermally conductive and electrically non-conductive material. In some examples, the attachment material comprises an epoxy-type die attach material. In other examples, the attachment material can be a solder material, such as a solder paste or other materials as known to one of ordinary skill in the art.

Block S930 of method 900 comprises attaching a conductive clip to the electronic device to provide a sub-assembly structure. For instance, the conductive clip can be similar to conductive clips 17 presented in FIGS. 1-18 having one or more of the described features that improve the attachment characteristics of conductive clip 17 to semiconductor device 16. Such features include, for example, one or more of sloped profiles, such as sloped profiles 176, 187 presented in FIGS. 2A, 2B, 12, 14, 16, and 18; through-holes, such as through-holes 171 presented in FIGS. 1, 2A-2C, 3-6, 8-12, and 15-18, channels, such as channels 179 presented in FIGS. 7-10 and 13-18; and/or conically shaped through-holes 171, such as conical shape 192 presented in FIGS. 11 and 12. These features can be combined with one or more bump structures, such as bump structures 15 as presented in FIGS. 1, 3, 5, 6, 7, and 8.

In some examples, the conductive clip is attached to the electronic device using a solder material. The solder material can be deposited on a surface of the electronic device and then the conductive clip is placed into contact with the solder material to provide a sub-assembly structure.

Block S940 of method 900 comprises exposing the sub-assembly structure to an elevated to temperature to reflow the conductive material thereby forming a bond between the conductive clip and the electronic device. In accordance with the present description, the feature(s) of the conductive clip (including those presented in FIGS. 1-18) promote(s) an increase in the amount of conductive material or solder material between the conductive clip and the electronic device thereby improving bond strength. In addition, during the process to reflow conductive material, the features of the conductive clip (including those presented in FIGS. 1-18) promote the removal of gas(es) or voids from between conductive clip and the electronic device thereby improving solder wettability. Further, the conductive material flows into the through-holes during processing thereby providing an anchoring effect for conductive clip to the electronic device Moreover, the conductive clip further reduces the overflow of conductive material from the connection area thereby reducing the possibility of electrical shorting issues. The above effects improve the yields and reliability of the packaged electronic device.

Block S950 of method 900 comprises attaching a conductive connective structure to the substrate and the electronic device. For instance, a conductive connective structure, such as conductive wire 21 can be attached to pad 24 on semiconductor device 16 and to one of conductive leads 112 as generally presented and described herein. The conductive wire can be provided using wire bonding techniques with wire comprising copper, gold, aluminum, or other conductive materials as known to one of ordinary skill in the art.

Block S960 of method 900 comprises encapsulating the sub-assembly with a package body. For instance, the package body can be similar to package body 36 presented and described herein. In some examples, the package body can be polymer based composite material, such as epoxy resin with filler, epoxy acrylate with filler, or polymer with proper filler. The package body comprises a non-conductive and environmentally protective material that protects the conductive clip, the conductive interconnect structure, and the electronic device from external elements and contaminants. The package body may be formed using paste printing, compressive molding, transfer molding, over-molding, liquid encapsulant molding, vacuum lamination, other suitable applicator, or other processes as known to those of skill in the art. In some examples, the package body is an epoxy mold compound ("EMC") and can be formed using transfer or injection molding techniques.

In summary, a packaged electronic device structure and associated methods have been described that comprise a conductive clip having one or more features that improve the bond integrity between the conductive clip and an electronic device. In some examples, the conductive clip comprises a sloped profile in cross-sectional view. In other examples, the conductive clip comprises a plurality of channels extending inward from a lower side of the conductive clip. In some examples, the channels have a fan-out pattern and can also have sloped shapes in cross-sectional view. In further examples, the conductive clip can comprise one or more through-holes. In still further examples, the through-hole can be of a conical shape to further provide an anchoring feature. The features can be combined with each other. The conductive clips can be incorporated into standard manufacturing flows to provide cost effective integration.

While the subject matter of the invention is described with specific example steps and example embodiments, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor device, comprising:
   a substrate comprising:
      a lead;
   a semiconductor component comprising:
      a component top side; and
      a component bottom side opposite to the component top side; and
   a conductive clip coupled to the semiconductor component and the substrate, wherein the conductive clip comprises:
      a plate portion attached to the component top side with a conductive material; and
      a clip connecting portion coupled to the plate portion and coupled to the lead, wherein:
         the plate portion comprises through-holes extending from an upper side of the plate portion to a lower side of the plate portion;
         the plate portion further comprises stand-offs extending from the lower side of the plate portion towards the component top side;
         the lower side of the plate portion comprises a first profile in a first cross-sectional view;
         the upper side of the plate portion comprises a second profile in the first cross-sectional view; and
         the stand-offs comprise a first standoff proximate to a first corner of the plate portion and a second stand-off proximate to second corner of the plate portion.

2. The semiconductor device of claim 1, wherein:
the through-holes are distributed in columns within the plate portion.

3. The semiconductor device of claim 2, wherein:
adjacent columns are offset with respect to each other.

4. The semiconductor device of claim 1, wherein:
the through-holes are distributed inward from the stand-offs.

5. The semiconductor device of claim 1, wherein:
a portion of the through-holes are disposed within the plate portion so as to enclose portions of the stand-offs.

6. The semiconductor device of claim 1, wherein:
a portion of the through-holes are disposed so as to abut the stand-offs.

7. The semiconductor device of claim 1, wherein:
the stand-offs are integral with the plate portion.

8. The semiconductor device of claim 1, wherein:
the first profile comprises a substantially flat profile.

9. The semiconductor device of claim 1, wherein:
the first profile and the second profile are different.

10. The semiconductor device of claim 1, wherein:
the conductive material surrounds side surfaces of the stand-offs and extends within the through-holes.

11. The semiconductor device of claim 1, wherein:
the first profile comprises a sloped profile; and
the conductive material contacts the lower side of the plate portion and comprises a thickness that laterally varies across the semiconductor component and conforms to the sloped profile in the first cross-sectional view.

12. The semiconductor device of claim 1, wherein:
the stand-offs comprise a third stand-off proximate to a third corner of the plate portion and a fourth stand-off proximate to a fourth corner of the plate portion.

13. The semiconductor device of claim 1, wherein:
the through-holes are distributed in an N×M matrix configuration.

14. The semiconductor device of claim 1, wherein:
the through-holes have different dimensions.

15. A packaged electronic device, comprising:
   a substrate comprising:
      a lead;
   an electronic device comprising:
      a device top side; and
      a device bottom side opposite to the device top side; and
   a conductive clip coupled to the substrate and the electronic device, wherein the conductive clip comprises:
      a plate portion attached to the device top side with a conductive material; and
      a clip connecting portion coupled to the plate portion and coupled to the lead, wherein:
         the plate portion comprises through-holes extending from an upper side of the plate portion to a lower side of the plate portion;
         the plate portion comprises stand-offs extending from the lower side of the plate portion towards device die top side; and
         at least two of the stand-offs are disposed proximate to opposing edges of the plate portion.

16. The packaged electronic device of claim 15, further comprising:
channels disposed to extend inward from a lower side of the plate portion above the device top side, wherein:
   the conductive material is disposed within the channels; and
   the channels extend only partially into the plate portion so that the upper side of the plate portion extends over the channels.

17. The packaged electronic device of claim 16, wherein:
at least some through-holes are disposed where pairs of channels intersect.

18. A packaged electronic device, comprising:
a substrate comprising:
  a lead;
an electronic device comprising:
  a device top side; and
  a device bottom side opposite to the device top side; and
a conductive clip coupled to the electronic device and the substrate, wherein the conductive clip comprises:
  a first portion attached to the device top side with a conductive material; and
  a second portion coupled to the first portion and coupled to the lead,
wherein the first portion comprises one or more of:
  a first sloped profile comprising an outer section towards a first edge portion of the first portion and an inner section towards a central portion of the first portion, with the outer section spaced away from the electronic device further than the inner section, wherein the conductive material contacts a lower side of the first portion of the conductive clip and comprises a thickness that laterally varies across the electronic device and conforms to the first sloped profile; or
  channels disposed to extend partially inward from a lower side of the first portion above the device top side, wherein the first portion of the conductive clip comprises a first portion upper side that extends over the channels.

19. The packaged electronic device of claim 18, wherein: the conductive clip comprises the first sloped profile.

20. The packaged electronic device of claim 18, wherein: the conductive clip comprises the channels.

\* \* \* \* \*